United States Patent
Strohmaier

(10) Patent No.: US 8,989,686 B2
(45) Date of Patent: Mar. 24, 2015

(54) LOCAL RADIO MODE FOR AM/FM BROADCASTS

(75) Inventor: Jason M. Strohmaier, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 876 days.

(21) Appl. No.: 12/888,576

(22) Filed: Sep. 23, 2010

(65) Prior Publication Data

US 2012/0077451 A1  Mar. 29, 2012

(51) Int. Cl.
  H04B 1/18 (2006.01)
  H03J 1/00 (2006.01)
  H04H 60/74 (2008.01)

(52) U.S. Cl.
  CPC .......... *H03J 1/0066* (2013.01); *H03J 1/0091* (2013.01); *H04H 60/74* (2013.01)
  USPC ...................................... 455/161.3

(58) Field of Classification Search
  USPC .......... 455/150.1, 152.1, 154.1, 154.2, 158.1, 455/158.2, 158.4, 158.5, 160.1, 161.1, 455/161.2, 161.3, 164.1, 164.2, 166.1, 455/166.2, 167.1, 179.1, 186.1, 186.2, 3.06, 455/344, 226.2, 226.4, 185.1; 340/4.3, 4.37
  See application file for complete search history.

(56) References Cited

U.S. PATENT DOCUMENTS

| | | | |
|---|---|---|---|
| 5,307,513 A | 4/1994 | Harada | |
| 5,640,696 A | 6/1997 | Ishikawa et al. | |
| 5,734,973 A | 3/1998 | Honda | |
| 6,021,320 A | 2/2000 | Bickford et al. | |
| 6,470,178 B1 | 10/2002 | Cummings-Hill et al. | |
| 7,369,825 B2 | 5/2008 | Slupe | |
| 7,403,755 B2 * | 7/2008 | Zehnle et al. | 455/186.1 |
| 7,587,185 B2 | 9/2009 | Nee | |
| 7,885,622 B2 * | 2/2011 | Krampf et al. | 455/154.1 |
| 8,516,372 B2 * | 8/2013 | Seeger | 715/713 |
| 2003/0083028 A1 * | 5/2003 | Williamson | 455/186.1 |
| 2007/0015457 A1 * | 1/2007 | Krampf et al. | 455/3.06 |
| 2007/0060082 A1 * | 3/2007 | Okumura et al. | 455/179.1 |
| 2007/0142024 A1 * | 6/2007 | Clayton et al. | 455/403 |
| 2008/0057891 A1 * | 3/2008 | Klunk | 455/186.1 |
| 2008/0280576 A1 * | 11/2008 | Zehnle et al. | 455/186.1 |
| 2009/0113300 A1 * | 4/2009 | Tuli | 715/716 |
| 2009/0129361 A1 | 5/2009 | Masamoto | |
| 2009/0176469 A1 * | 7/2009 | Nagara et al. | 455/186.1 |

* cited by examiner

*Primary Examiner* — Nay A Maung
*Assistant Examiner* — Mark Woodall
(74) *Attorney, Agent, or Firm* — Fay Sharpe LLP

(57) ABSTRACT

A vehicle radio includes a memory including normal mode memory locations and local mode memory locations. User preset buttons are each associated with a normal mode memory location, and local preset buttons are each associated with a local mode memory location. A radio controller selectively operates in local mode, wherein the radio controller scans frequencies being received and stores some of the received frequencies as local mode frequencies in the local mode memory locations of the preset memory. In local mode, the controller enables both: selection of any one of the user presets; and selection of any one of the local presets. Optionally, the local memory locations can first be filled by PTY preference, with unfilled locations filled by closest PTY or signal strength. A frequency stored in a local mode memory location can be copied to a normal mode memory location.

3 Claims, 4 Drawing Sheets

LOCAL RADIO MODE FOR AM/FM BROADCASTS

BACKGROUND

FIG. 1 diagrammatically illustrates one example of a conventional vehicle radio R'. The radio includes an electronic radio controller RC' that controls all functions and operations of the radio as described herein. The radio R' includes a digital display D' for displaying the frequency of the radio station being received. The received radio station audio signal is output by the radio controller through one or more vehicle speakers SP. A volume control knob or other control V' allows the user to adjust the sound volume output by the speakers SP. Up and down tuner buttons TU',TD' (or a rotatable knob) are provided for adjusting the frequency of the radio station to be received and output by the radio R'. Seek and scan buttons K',N' are typically also provided for incrementing the radio tuner to the next receivable frequency as is generally known in the art. A plurality of user preset buttons P' (six buttons P1 through P6 as shown herein, but any other number of user preset buttons can be used) are provided for immediately tuning the radio to a user-stored preset frequency when the user present button P' is depressed/selected, wherein the user is able to assign a favorite radio frequency to each available user preset button P'. In particular, the radio controller RC' includes and/or is operatively connected to a preset memory M', and each user preset button P is associated with a memory location that stores a desired radio frequency as stored therein by the vehicle owner or other user of the radio R'. The user preset buttons P', like all other buttons described herein, can be hardware buttons/switches (as shown in FIG. 1) and/or can be software buttons/switches provided by a graphical user interface output on the digital display D' or another digital display. The radio R' also includes band select buttons B' that change the radio-frequency band received and output by the radio, typically at least between AM band and FM band as shown herein (other bands such as satellite band are sometimes included).

In a normal mode of operation, when the AM band select button B' is selected (i.e., when the radio in set to AM mode), the radio controller RC' associates the plurality of user preset buttons P1-P6 with a respective plurality of memory locations M1*am*-M6*am* in which the user's favorite or other desired preset AM band radio station frequencies are stored. When the FM1 band select button is selected (i.e., when the radio is set to FM1 mode), the radio controller RC' associates the plurality of user preset buttons P1-P6 with a first respective plurality of memory locations M1*fm*-M6*fm* in which a first group of the user's favorite or other desired preset FM band radio station frequencies are stored, and when the FM2 band select button is selected (i.e., when the radio is set to FM2 mode), the radio controller RC' associates the plurality of user preset buttons P1-P6 with a second respective plurality of memory locations M7*fm*-M12*fm* in which a second group of the user's favorite or other desired preset FM band radio station frequencies are stored.

The radio R' also includes an Auto Select button AS' that, when selected by a user, causes the radio controller RC' to implement an auto select mode in which the radio controller scans the available AM and FM frequencies being received and stores some of the received frequencies in the preset memory as follows:

the strongest received AM radio frequencies are stored in the available auto select AM memory locations L1*am*-L6*am*; and, the strongest received FM radio frequencies are stored in the available auto select FM memory locations L1*fm*-L12*fm*

Also, when auto select mode is active, the radio controller re-maps the user preset buttons P' to the auto select memory locations as follows:

in AM mode (combined with auto select mode), the radio controller RC' associates the plurality of user preset buttons P1-P6 respectively with the plurality of auto select AM memory locations L1*am*-L6*am*;

in FM1 mode (combined with auto select mode), the radio controller RC' associates the plurality of user preset buttons P1-P6 respectively with a first plurality of auto select FM memory locations L1*fm*-L6*fm*;

in FM2 mode (combined with auto select mode), the radio controller RC' associates the plurality of user preset buttons P1-P6 respectively with a second plurality of auto select FM memory locations L7*fm*-L12*fm*.

As such, when the auto select mode is active, the normal mode AM/FM1/FM2 memory locations M1*am*-M6*am*/M1*fm*-M6*fm*/M7*fm*-M12*fm* are disassociated from the user preset buttons P and are unavailable for use, in favor of the auto select AM/auto select FM1/auto select FM2 memory locations L1*am*-L6*am*/L1*fm*-L6*fm*/L7*fm*-L12*fm*. The auto select mode is terminated by selecting the Auto Select button AS' again or by other means to deactivate auto select mode, at which time the radio controller RC' resumes its normal mode of operation previously described.

Many radio users do not understand the operation of the auto select mode associated with the Auto Select button AS'. In particular, many users do not understand that the auto select mode does not permanently overwrite their stored frequencies in the normal mode memory locations but, instead, only temporarily re-maps the user preset buttons P1-P6 to the auto select mode memory locations L1*am*-L6*am* or L1*fm*-L12*fm* depending upon whether the radio is in AM mode, FM1 mode, or FM2 mode. Users become concerned or confused when the frequencies normally associated with the user preset buttons P in the AM/FM1/FM2 bands are no longer available. This lack of understanding of the auto select mode has limited its acceptance and use among vehicle owners and others using vehicle radios such as the radio R' of FIG. 1.

SUMMARY

In accordance with one exemplary embodiment, a radio for a vehicle includes a preset memory comprising a plurality of normal mode memory locations and a plurality of local mode memory locations. The radio further includes a plurality of user preset buttons that are each associated with a respective normal mode memory location, and a plurality of local preset buttons that are separate from the user preset buttons, each of said local preset buttons associated with a respective local mode memory location. The radio also includes a radio controller that selectively operates in a local mode, wherein the radio controller scans radio frequencies being received by said radio and stores some of the received frequencies as local mode frequencies respectively in the local mode memory locations of the preset memory, wherein the radio controller, when in local mode, enables both: (i) selection of any one of the user preset buttons for user selection and tuning of the radio to the user-stored radio frequency stored in the normal mode memory location associated with the selected user preset button; (ii) selection of any one of the local preset buttons for user selection and tuning of the radio to the local mode radio frequency stored in the local mode memory location associated with the selected local preset button.

In accordance with another exemplary embodiment, a method for providing local mode of operation for a vehicle radio includes scanning local radio frequencies being received by the radio and storing some of the received radio frequencies as local mode frequencies respectively in local mode memory locations of a preset memory based upon strongest signal strength. A plurality of local preset buttons are activated that are respectively operatively associated with said local mode memory locations such that a user selection of one of the local preset buttons tunes the radio to the local mode frequency stored in the corresponding local mode memory location. The plurality of local preset buttons are activated while a plurality of user preset buttons that are respectively operatively associated with normal mode memory locations in which a user preset radio frequencies remain active and available for use.

DETAILED DESCRIPTION

Figure 1:
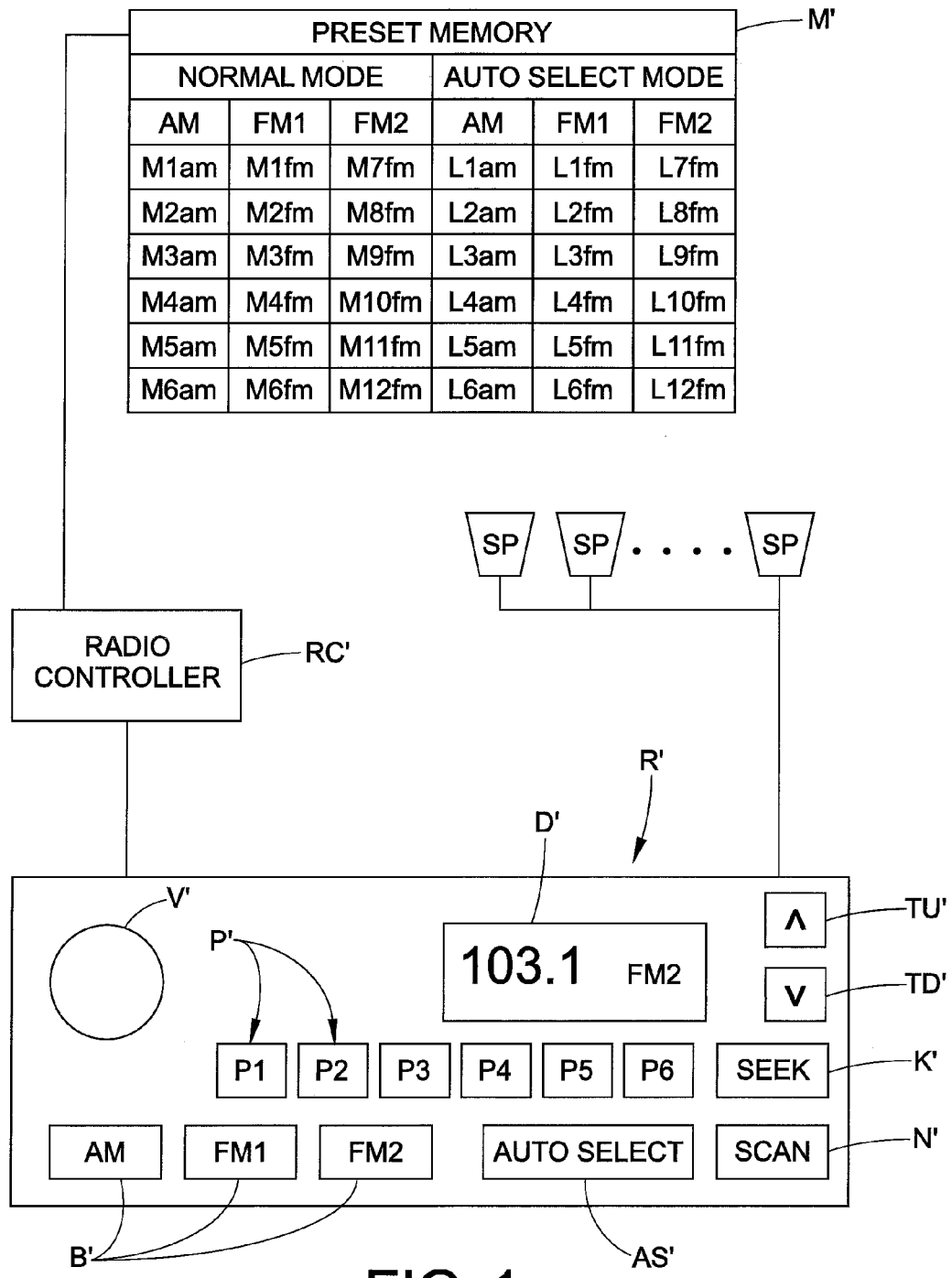
FIG. 1 discloses an example of a conventional vehicle radio.
Figure 2:
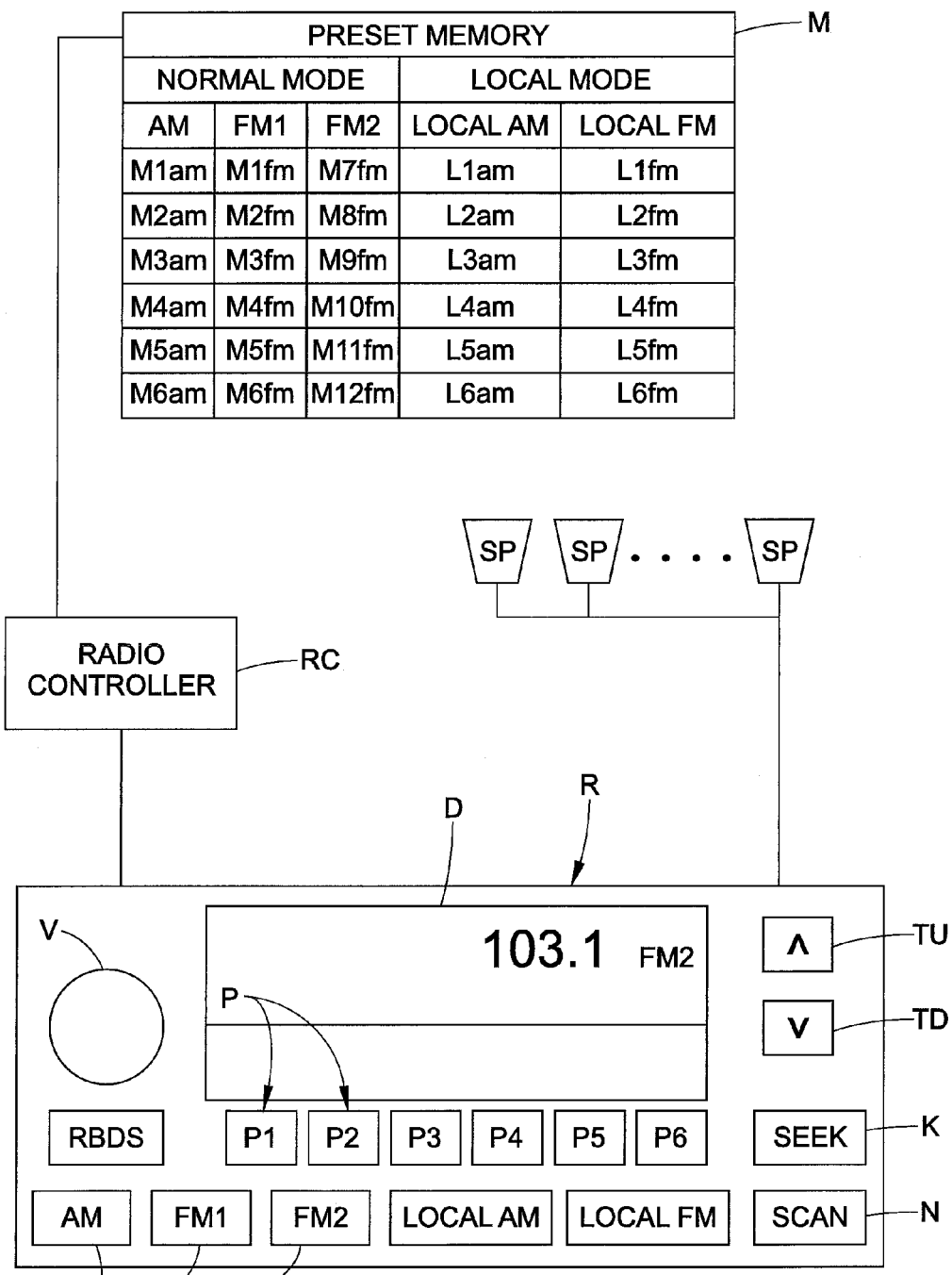
FIG. 2 illustrates an exemplary embodiment of a vehicle radio formed in accordance with the present development, operating in normal AM or FM mode.

FIG. 2 illustrates a vehicle radio R formed in accordance with the an exemplary embodiment of the present development, for use in a car, truck, minivan or any other vehicle. The radio R includes an electronic radio controller RC comprising one or more special purpose electronic circuits/chips and/or programmed general purpose electronic circuits/chips that control all functions and operations of the radio R as described herein. The radio R includes a digital display D for displaying the frequency of the radio station being received along with other information such as the frequency band and Radio Data System/Radio Broadcast Data System (RDS/RBDS) data. The audio signal of the radio station being received is output through one or more vehicle speakers SP. A volume control knob or other control V allows the user to adjust the sound volume of the speakers SP. Up and down tuner buttons TU,TD (or a rotatable knob) are provided for adjusting the frequency of the radio station to be received and output by the radio R. Seek and scan buttons K,N are typically also provided for incrementing the radio tuner to the next receivable frequency as is generally known in the art. A plurality of user preset buttons P (six buttons P1 through P6 as shown herein, but any other number of preset buttons can be used) are provided for immediately tuning the radio to a preset frequency when the user present button P is depressed/selected, wherein the user is able to assign a favorite radio frequency to each available user preset button P. In particular, the radio controller RC includes and/or is operatively connected to a preset memory M, and each user preset button P is associated with a memory location that contains a desired radio frequency as stored therein by the vehicle owner or other use of the radio R. The user preset buttons P, like all other buttons described herein, can be hardware buttons/switches (as shown in FIG. 2) and/or can be software buttons/switches provided by a graphical user interface output on the digital display D or another digital display. The radio R also includes band select buttons B that change the radio-frequency band received and output by the radio, typically at least between AM band and FM band as shown herein (other bands such as satellite band are sometimes included).

In a normal mode of operation, when the AM band select button is selected (i.e., when the radio in set to AM mode), the radio controller RC associates the plurality of user preset buttons P1-P6 with a respective plurality of memory locations M1am-M6am in which the user's favorite or other desired preset AM band radio station frequencies are stored. When the FM1 band select button is selected (i.e., when the radio is set to FM1 mode), the radio controller RC associates the plurality of user preset buttons P1-P6 with a first respective plurality of memory locations M1fm-M6fm in which a first group of the user's favorite or other desired preset FM band radio station frequencies are stored, and when the FM2 band select button is selected (i.e., when the radio is set to FM2 mode), the radio controller RC associates the plurality of user preset buttons P1-P6 with a second respective plurality of memory locations M7fm-M12fm in which a second group of the user's favorite or other desired preset FM band radio station frequencies are stored.

Figure 3:
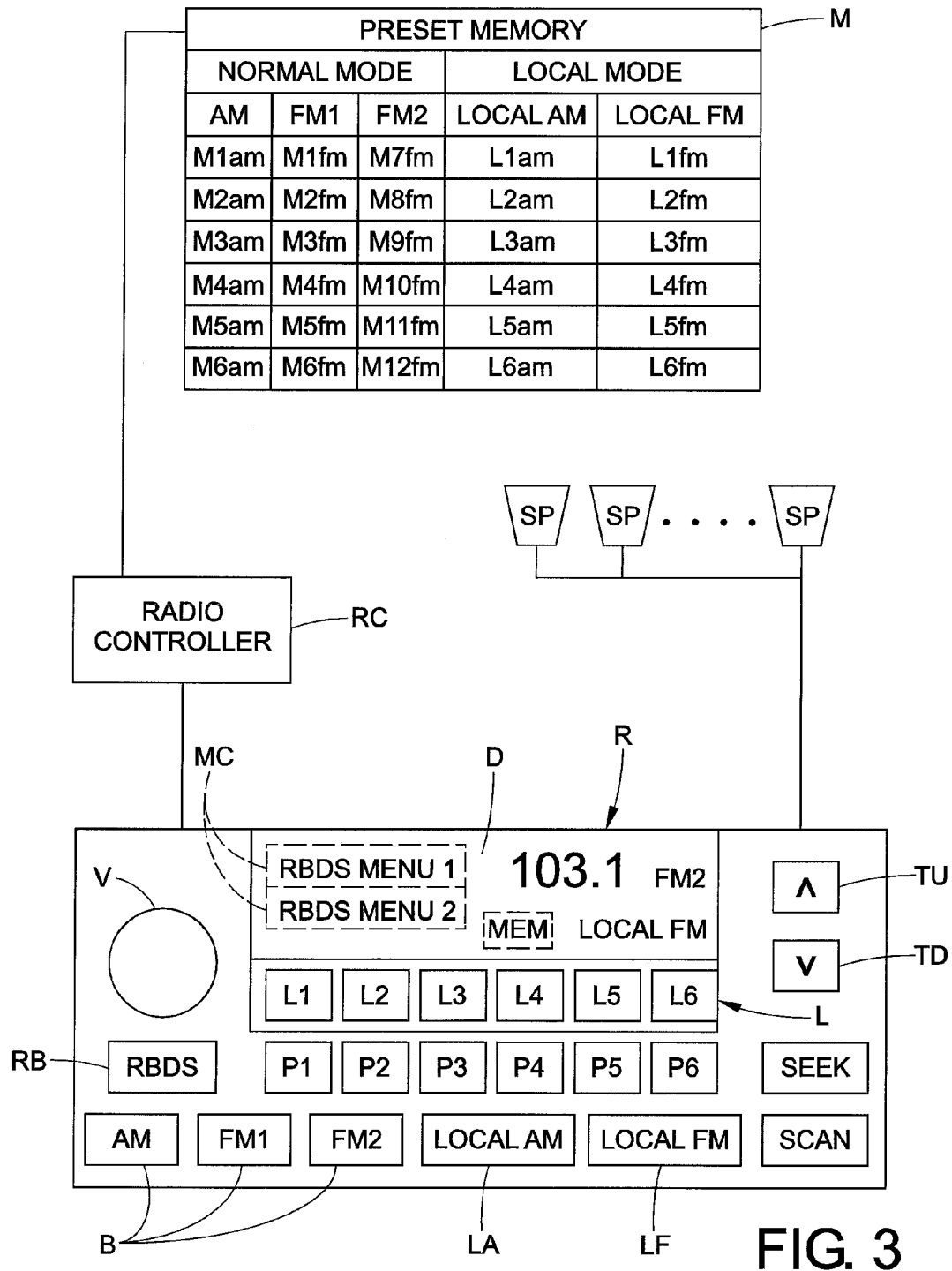
FIG. 3 illustrates the vehicle radio of FIG. 2 operating in a local mode.

In FIG. 2, the radio is operating in the above-described normal mode of operation, in particular, in the FM2 local mode of operation as indicated on display D. Referring now also to FIG. 3, it can be seen that, unlike the radio R', the radio R also implements at least one local mode of operation. In the exemplary embodiment, the radio R implements two different local modes: (i) a local AM mode; and (ii) a local FM mode. The radio R includes thus includes a corresponding Local AM button LA for selectively activating the local AM mode, and includes a Local FM button LF for selectively activating the local FM mode.

FIG. 3 illustrates the radio R when it is operating in one of its local modes, in particular, in the local FM mode as indicated on display D. When the radio is operating in local mode, the digital display D or another display provides a graphical user interface for a plurality of different local preset buttons L (six different local preset buttons L1-L6 in the exemplary embodiment). Like the illustrated user preset buttons, the local preset buttons L can alternatively be provided as hardware buttons/switches that are physically present on the radio R and/or can be provided as graphical user interface buttons as shown. The use of the display D to implement the local preset buttons L is advantageous in that it allows the local preset buttons to be displayed only when the radio R is in a local mode of operation to avoid user confusion.

When the radio R is operating in local mode, the radio controller RC scans the available radio frequencies being received and stores some of the received frequencies in the preset memory as follows:

for local AM mode, the strongest received AM radio frequencies are stored in the available local mode AM memory locations L1am-L6am (the actual number of local mode AM memory locations can vary); and, for local FM mode, the strongest received FM radio frequencies are stored in the available local mode FM memory locations L1fm-L6fm (the actual number of local mode FM memory locations can vary).

When the radio R is operating in local AM or local FM mode, the radio controller RC associates the local preset buttons L with the local mode memory locations as follows:

in local AM mode, the radio controller RC associates the plurality of local preset buttons L1-L6 respectively with the plurality of local mode AM memory locations L1am-L6am;

in local FM mode, the radio controller RC associates the plurality of preset buttons L1-L6 respectively with the plurality of local mode FM memory locations L1*fm*-L6*fm*.

When the radio is operating in local mode, the normal mode AM/FM1/FM2 memory locations M1*am*-M6*am*/M1*fm*-M6*fm*/M7*fm*-M12*fm* continue to be associated with the user preset buttons P1-P6 and are available for use. Thus, during local mode operation of the radio R, when a user selects one of the user presets P1-P6, the radio controller RC will tune the radio to the frequency stored in the corresponding normal mode memory location M1*am*-M6*am* (in local AM mode) or M1*fm*-M12*fm* (in local FM mode—depending upon whether the FM1 or FM2 band select button B is also selected), and when the user selects one of the local presents L1-L6, the radio controller RC tunes the radio R to the frequency stored in the corresponding local mode memory location L1*am*-L6*am* (for local AM mode) or L1*fm*-L6*fm* (for local FM mode). The local mode is terminated by selecting the corresponding local mode button LA or LF again to toggle back to normal mode.

It should be noted that while a radio R is tuned to a radio station during its local mode of operation, a user can re-program any one of the user preset buttons P to store the frequency of the currently playing radio station in the corresponding normal mode memory location M1*am*-M6*am* (for an AM station), M1*fm*-M12*fm* (for an FM station). In this manner, the radio frequency stored in one of the local mode memory locations is copied to a desired normal mode memory location. For example, when the radio R is tuned to one of the frequencies stored in a local mode memory location, the digital display includes a Memory button MEM that can be selected by a user. Upon user selection of the Memory button MEM, the radio controller RC will cause the digital display D to prompt the user to select one of the user preset memory locations P1-P6 and will prompt the user to select one of the bands AM/FM1/FM2 so that the radio station frequency currently being played by the radio will be stored in the corresponding normal mode memory location according to the user input.

The local FM mode operation of the radio R can optionally be combined with an RDS/RBDS mode of operation (referred to herein as RBDS) to provide a local+RBDS mode of operation. As is generally known in the art, fm radio stations broadcast RBDS data with their audio signal. The RBDS data provide information concerning the name of the radio station, the call letters of the radio station, the program type (PTY) for the radio station (e.g., the artist and song being played), and the like. The PTY component of the RBDS data classifies the radio station as one of a plurality of different types or genres such as news, sports, talk, classical, jazz, top 40, etc. according to a published standard. The radio R includes an RBDS button (hardware or graphical user interface) RB that, when selected, causes the radio controller to operate in an RBDS mode, in addition to its normal or local fm mode. When the RBDS mode is active during the radio's normal fm mode of operation, the digital display D will display all available RBDS data in a conventional manner as is generally known. When the RBDS mode is active during the radio's local fm mode of operation (referred to herein as local+RBDS mode), the radio controller RC will cause the digital display D to output RBDS menu choices MC to the user by which the user:

selects from a displayed list the program type (PTY) to be favored when the radio controller RC scans the available fm frequencies being received and stores some of the received frequencies in the local mode memory locations L1*fm*-L6*fm*; and, selects from a displayed list the fill method to be used by the radio controller RC to fill any extra remaining local mode memory locations after the frequencies of all available radio stations of the preferred program type (PTY) are stored in the local mode memory locations. The method can be "signal strength" (fill remaining local mode memory locations by strongest signal) or "closest PTY" (fill remaining local mode memory locations with a program type (PTY) that is closest to that selected by the user.

In particular, the program type PTY selected by the user will take precedence over all others when the radio controller RC scans the available frequencies being received and the local mode memory locations L1*fm*-L6*fm* will first be filled with radio frequencies broadcasting with the desired program type PTY. If extra local memory locations remain available, the radio controller RC will fill same on the basis of "signal strength" or on the basis of "closest PTY" according to the user input selection as described above.

Figure 4:
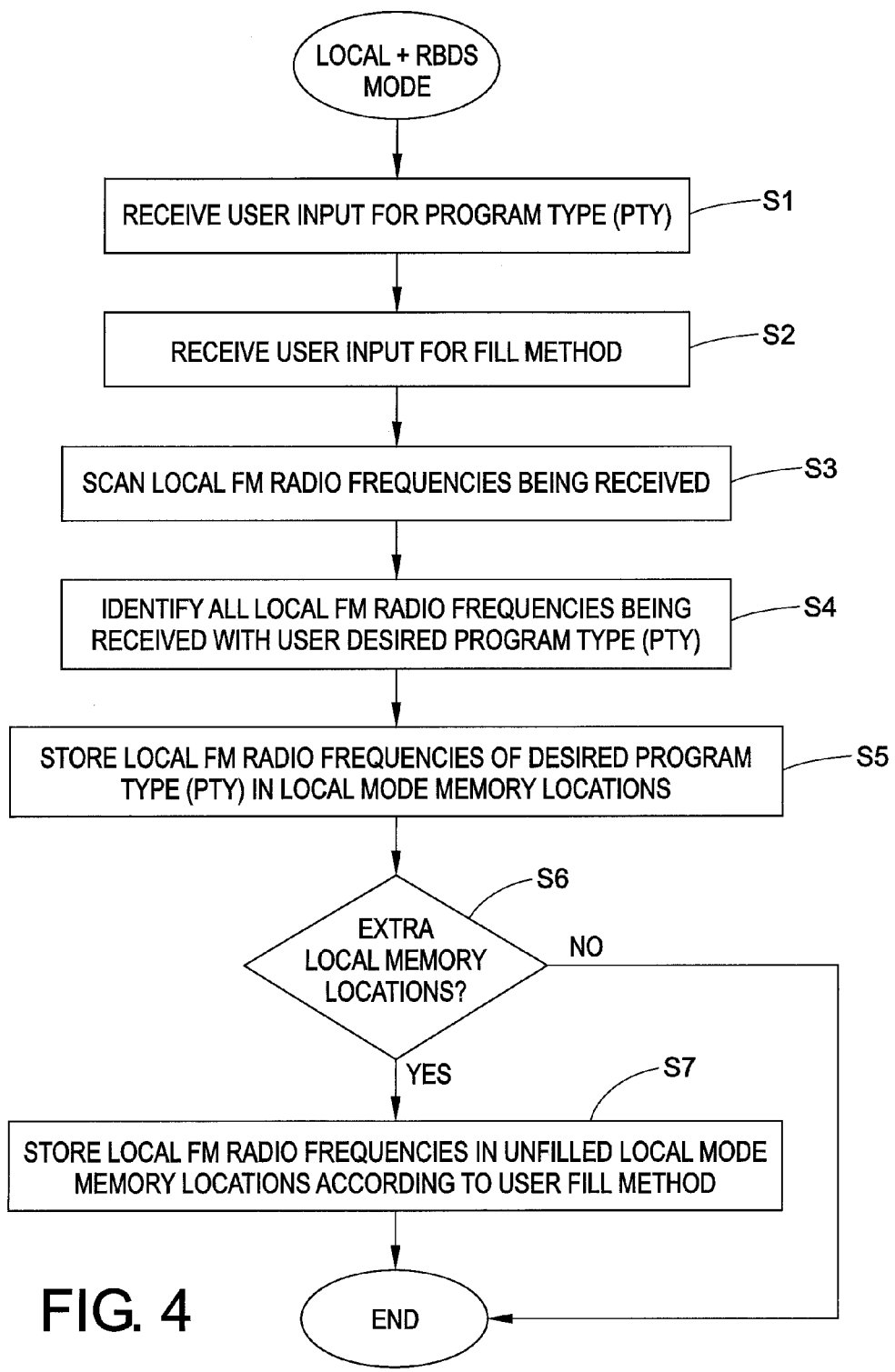
FIG. 4 is a flow chart that shows an exemplary embodiment of a local+RBDS mode for the radio of FIGS. 2 and 3.

FIG. 4 is a flow chart that shows an exemplary embodiment of a local+RBDS mode for the radio of FIGS. 2 and 3. In a step S1, the radio user, via RBDS menu choices MC, inputs the program type (PTY) desired for filling the local mode memory locations L1*fm*-L6*fm*. In a step S2, the radio user operates the RBDS menu choices MC to input the desired fill method by which the radio controller RC should fill any extra remaining local mode memory locations after the frequencies of the desired program type (PTY) have been stored. In a step S3, the radio controller RC scans the local fm broadcast frequencies being received by the radio R. In step S4, the radio controller identifies all local fm broadcast frequencies of the desired program type (PTY) according to the user input from step S1. In a step S5, the radio controller RC stores the local fm broadcast frequencies of the desired program type (PTY) (in order of signal strength) respectively in the available local mode memory locations L1*fm*-L6*fm*. In a step S6, the radio controller RC determines if extra local memory locations L1*fm*-L6*fm* exist after the completion of the storing step S5. If not, the process ends; if so, a step S7 is carried out to store local mode radio frequencies in the unfilled local mode memory locations L1*fm*-L6*fm* according to the user input received in step S2, i.e., in order of strongest available local broadcast frequencies (of any program type (PTY)) or in order of received local broadcast frequencies that are closest in terms of program type (PTY) to the program type (PTY) input by the user in step S1. In one exemplary embodiment, the closest program type (PTY) is determined according to the next sequentially higher program type (PTY) code (or alternatively according to the next sequentially lower program type (PTY) code). With both the "signal strength" or "closest PTY" fill method, duplicate radio frequencies to those already stored in the local memory locations are ignored so as to avoid the occurrence of duplicates in the local memory locations, i.e., during the fill operation, the radio controller compares the fill radio frequencies with those already stored and discards duplicates.

The disclosure has been described with reference to the exemplary embodiments. Modifications and alterations will occur to others upon reading and understanding the preceding detailed description, and it is intended that the disclosure be construed as including all such modifications and alterations in so far as they come within the scope of the appended claims or the equivalents thereof.

The invention claimed is:

1. A vehicle radio comprising:
   a preset memory comprising a plurality of normal mode memory locations and a plurality of local mode memory locations, wherein said local mode memory locations comprise: (i) a plurality of local mode AM memory locations for storing local mode AM radio frequencies; and, (ii) a plurality of local mode FM memory locations for storing local mode FM radio frequencies;

a plurality of user preset buttons that are each associated with a respective normal mode memory location, wherein said user preset buttons comprise hardware buttons;

a plurality of local preset buttons that are separate from the user preset buttons, each of said local preset buttons associated with a respective local mode memory location, wherein said local preset buttons comprise graphical user interface buttons that are displayed on a digital display only when said radio controller operates in said local mode;

a radio controller that selectively operates in a local mode in which said radio controller scans radio frequencies being received by said radio and stores some of the received frequencies as local mode frequencies respectively in the local mode memory locations of the preset memory, wherein said radio controller selectively operates in a local+RBDS mode of operation in which:

said radio controller causes said digital display to output a user selectable list of fill method menu choices including: (i) a signal strength menu choice; and (ii) a closest PTY menu choice;

said radio controller scans available radio frequencies being received by said radio and stores some of the received frequencies as local mode frequencies respectively in the local mode memory locations of the preset memory based:

first upon a user selected RBDS program type (PTY) for all available local mode memory locations, wherein said RBDS program type (PTY) is input by a user said radio controller; and second, if any unused local mode memory locations are available after said local mode memory locations are filled based upon user selected RBDS program type (PTY), upon one of either signal strength or closest PTY based upon user input selection of one of said fill method menu choices that indicates a user preference as to how said unused local mode memory locations should be filled, wherein said radio controller automatically stores plural radio frequencies in said unused local mode memory locations based upon strongest signal strength if said user input selection corresponds to said signal strength menu choice, and wherein said radio controller stores radio frequencies in said unused local mode memory locations based upon closest PTY to said user selected RBDS program type (PTY) if said user input selection corresponds to said closest PTY menu choice;

wherein said radio controller, when in said local mode, simultaneously enables both:

selection of any one of the user preset buttons for user selection and tuning of the radio to the user-stored radio frequency stored in the normal mode memory location associated with the selected user preset button while said local preset buttons are displayed and active on said digital display; and selection of any one of the local preset buttons for user selection and tuning of the radio to the local mode radio frequency stored in the local mode memory location associated with the selected local preset button.

2. A method for providing local mode of operation for a vehicle radio, said method comprising:

operatively associating a plurality of user hardware preset buttons with a respective plurality of normal mode memory locations in which a user preset radio frequencies are stored such that user selection of one of said user hardware present buttons tunes said vehicle radio to said radio frequency stored in said normal mode memory location associated with said selected one of said user hardware present buttons;

receiving user input for a select program type (PTY) to be stored in said local mode memory locations;

scanning local radio frequencies being received by the radio;

identifying all local radio frequencies being received by the radio having the user-input select program type (PTY);

storing the identified local radio frequencies of the user-input select program type (PTY) as local mode frequencies respectively in the available local mode memory locations in order of strongest signal strength;

operating a digital display of said digital radio to output a user selectable list of fill method menu choices including: (i) a signal strength menu choice; and (ii) a closest PTY menu choice;

receiving user input selection of one of said fill method menu choices displayed on said digital display for a fill method to be used for filling unused local mode memory locations, said step of receiving user input for a fill method to be used for filling said unused local mode memory locations comprising receiving user input that selects one of: (i) said signal strength menu choice corresponding to a signal strength fill method for filling said unused local memory locations in order of strongest signal strength; (ii) said closest PTY menu choice corresponding to a closest PTY method for filling said unused local memory locations using received radio frequencies that are closest in term of program type (PTY) with said user-input select program type (PTY);

if any unused local mode memory locations exist after said step of storing the identified local radio frequencies of the user-input program type (PTY) as local mode frequencies respectively in the available local mode memory locations in order of strongest signal strength, the radio automatically storing plural local mode radio frequencies being received by said radio in the unused local mode memory locations according to the user input fill method such that said unused local mode memory locations are filled according to one of: (i) a signal strength fill method for filling said unused local memory locations in order of strongest signal strength; (ii) a closest PTY method for filling said unused local memory locations using received radio frequencies that are closest in term of program type (PTY) with said user-input select program type (PTY);

operating said digital display to display a plurality of graphical user interface to local preset buttons that are respectively operatively associated with said local mode memory locations such that user selection of one of the local preset buttons tunes the radio to the local mode frequency stored in the corresponding local mode memory location, wherein said plurality of user hardware preset buttons that are respectively operatively associated with said normal mode memory locations remain active and available for selection while said plurality of graphical user interface local preset buttons are displayed on said digital display and active for selection of said local mode frequencies respectively stored in said local mode memory locations.

3. The local radio mode method as set forth in claim 2, wherein said fill method comprises discarding a local mode radio frequency that is a duplicate of a local mode radio frequency already stored in one of said local mode memory locations.

\* \* \* \* \*